(12) United States Patent
Kato (10) Patent No.: US 11,167,544 B2
(45) Date of Patent: Nov. 9, 2021

(54) SCREEN PRINTER

(71) Applicant: FUJI CORPORATION, Chiryu (JP)

(72) Inventor: Mitsuaki Kato, Anjyo (JP)

(73) Assignee: FUJI CORPORATION, Chiryu (JP)

( * ) Notice: Subject to any disclaimer, the term of this patent is extended or adjusted under 35 U.S.C. 154(b) by 189 days.

(21) Appl. No.: 16/475,847

(22) PCT Filed: Jan. 6, 2017

(86) PCT No.: PCT/JP2017/000234
§ 371 (c)(1),
(2) Date: Jul. 3, 2019

(87) PCT Pub. No.: WO2018/127966
PCT Pub. Date: Jul. 12, 2018

(65) Prior Publication Data
US 2019/0351670 A1    Nov. 21, 2019

(51) Int. Cl.
*B41F 15/44* (2006.01)
*B41F 33/16* (2006.01)

(52) U.S. Cl.
CPC .............. *B41F 15/44* (2013.01); *B41F 33/16* (2013.01)

(58) Field of Classification Search
CPC ....................................................... B41F 15/44
(Continued)

(56) References Cited

U.S. PATENT DOCUMENTS 6,363,846 B1 * 4/2002 Murakami .............. B41F 15/12
101/123
6,715,413 B2 * 4/2004 Yamasaki ................. B41C 1/14
101/123
(Continued)

FOREIGN PATENT DOCUMENTS

JP         8-34111 A     2/1996
JP    2013-157537 A     8/2013

OTHER PUBLICATIONS

International Search Report dated Mar. 21, 2017 in PCT/JP2017/000234 filed on Jan. 6, 2017.

*Primary Examiner* — Anthony H Nguyen
(74) *Attorney, Agent, or Firm* — Oblon, McClelland, Maier & Neustadt, L.L.P.

(57) ABSTRACT

A screen printer comprising: a board positioning device configured to convey and hold a board to a work position in the screen printer; a mask holding device configured to hold a mask above the work position; a squeegee device configured to spread a cream solder on a mask on the board; a correction device configured to correct a relative position between the board of the board positioning device and the mask of the mask holding device; a control device configured to acquire inspection data of a print state from a print inspection device provided inside or outside the screen printer and perform correction control on the correction device by a correction value corrected according to a deviation amount of printing based on the inspection data; and an input device configured to include an instruction input section that senses an inspection instruction operation of an operator and transmit, to the control device, an inspection data acquisition signal for acquiring the inspection data of (Continued)

the print state from the print inspection device based on an instruction operation of the operator to the instruction input section.

5 Claims, 6 Drawing Sheets

(58) Field of Classification Search
 USPC .......................................................... 101/123
 See application file for complete search history.

(56) References Cited

U.S. PATENT DOCUMENTS

| | | | | |
|---|---|---|---|---|
| 2004/0146195 | A1* | 7/2004 | Fukagawa .......... | H05K 13/0817 382/150 |
| 2008/0289175 | A1* | 11/2008 | Inoue ................... | H05K 3/3485 29/840 |
| 2013/0170735 | A1* | 7/2013 | Abe ........................ | B41F 15/26 382/151 |
| 2015/0367626 | A1* | 12/2015 | Mantani .................. | B41F 15/44 101/123 |

* cited by examiner

SCREEN PRINTER

TECHNICAL FIELD

The present application relates to a screen printer that acquires inspection data to correct a correction value for positional deviation correction at any given timing.

BACKGROUND ART

In a screen printer, a board is placed under a mask in which print pattern holes are formed, and a cream solder is spread on the mask. Then, the cream solder passes through the print pattern holes and is applied to the board, whereby a print pattern is formed on the board. In this case, when a positional deviation occurs between the mask and the board, a deviation or the like occurs in the print pattern of the board. Since such a printing defect would lower the quality of a circuit board as a product, the screen printer corrects the positional deviation to make constant the positional relationship between the board and the mask. Further, in order to perform an appropriate positional deviation correction, inspection of the print state is performed and upon detecting a print deviation by the inspection, the deviation amount is input as an offset value in a positional deviation correction process.

The inspecting of the print state is a process necessary to ensure the quality of the product. However, if the print state is inspected for each board printed in the screen printer, the cycle time becomes long, which may result in lowered productivity. Therefore, for example, Patent Literature 1 discloses a configuration in which an automatic operation is stopped when the number of printed boards reaches 100 based on a setting of an inspection mode and the print state of the 100th board is inspected. Further, Patent Literature 2 discloses a determination that is made as to whether an inspection is performed after printing, the determination being made in accordance with, for example, an instruction from a user (operator).

PATENT LITERATURE

PTL 1: JP-A-Hei-08-034111
PTL 2: JP-A-2013-157537

BRIEF SUMMARY

Technical Problem

With the technique described in Patent Literature 1, by performing the inspection only once every 100 times as in the previous example, the number of inspections can be significantly reduced compared with performing the inspection every time. However, an inspection of the print state may be necessary depending on the operation, such as a changeover, performed on the screen printer by the operator. In some cases, it may be preferable for the operator to inspect the print state according to the situation while checking the print state instead of inspecting the print state after a predetermined number of printings. That is to say, in a case where the inspection is performed under a preset condition, it is not possible to respond properly to changing manufacturing situations. Further, in Patent Literature 2, although the instruction of the operator is followed, when the content of the instruction is not obvious, for example, when the instruction is based on some condition setting, it is not possible to handle similar changing manufacturing situations.

In order to solve the problem described above, an object of the present disclosure is to provide a screen printer which acquires inspection data of the print state based on an inspection instruction operation of an operator.

Solution to Problem

A screen printer according to an aspect of the present disclosure includes a board positioning device configured to convey and hold a board to a work position in the screen printer, a mask holding device configured to hold a mask above the work position, a squeegee device configured to spread a cream solder on a mask on the board, a correction device configured to correct a relative position between the board of the board positioning device and the mask of the mask holding device, a control device configured to acquire inspection data of a print state from a print inspection device provided inside or outside the screen printer and perform correction control on the correction device by a correction value corrected according to a deviation amount of printing based on the inspection data, and an input device configured to include an instruction input section that senses an inspection instruction operation of an operator, and transmit, to the control device, an inspection data acquisition signal for acquiring the inspection data of the print state from the print inspection device, based on an instruction operation of the operator to the instruction input section.

Advantageous Effects

With the above configuration, the inspection data of the print state is acquired from the print inspection device and the relative position between the board and the mask is corrected by the correction value corrected according to the deviation amount of printing based on the inspection data, but the acquisition of the inspection data can be limited to the case where the instruction operation of the operator to the instruction input section of the input device is performed.

DESCRIPTION OF EMBODIMENTS

Figure 1:
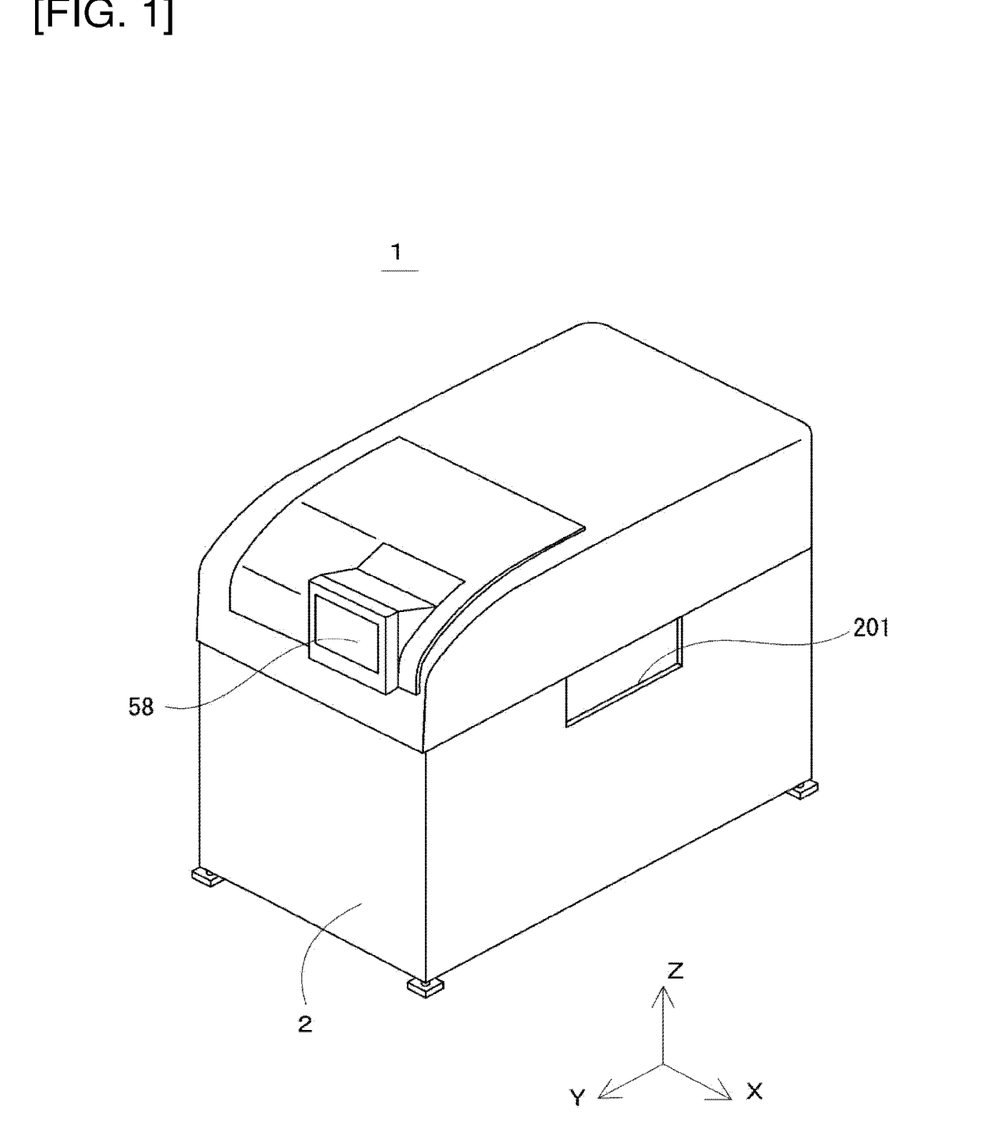
FIG. 1 is an appearance perspective view showing a screen printer.

Next, an embodiment of a screen printer according to the present disclosure will be described below with reference to the drawings. FIG. 1 is an appearance perspective view showing the screen printer of the present embodiment. Screen printer 1 prints cream solder on a board and constitutes a circuit board production line together with, for example, a solder inspector for inspecting a print state, a component mounter for mounting electronic components on a board, and the like. As will be described later, screen printer 1 of the present embodiment is provided with an internal print inspection device such that the print state can be inspected in the screen printer.

Figure 2:
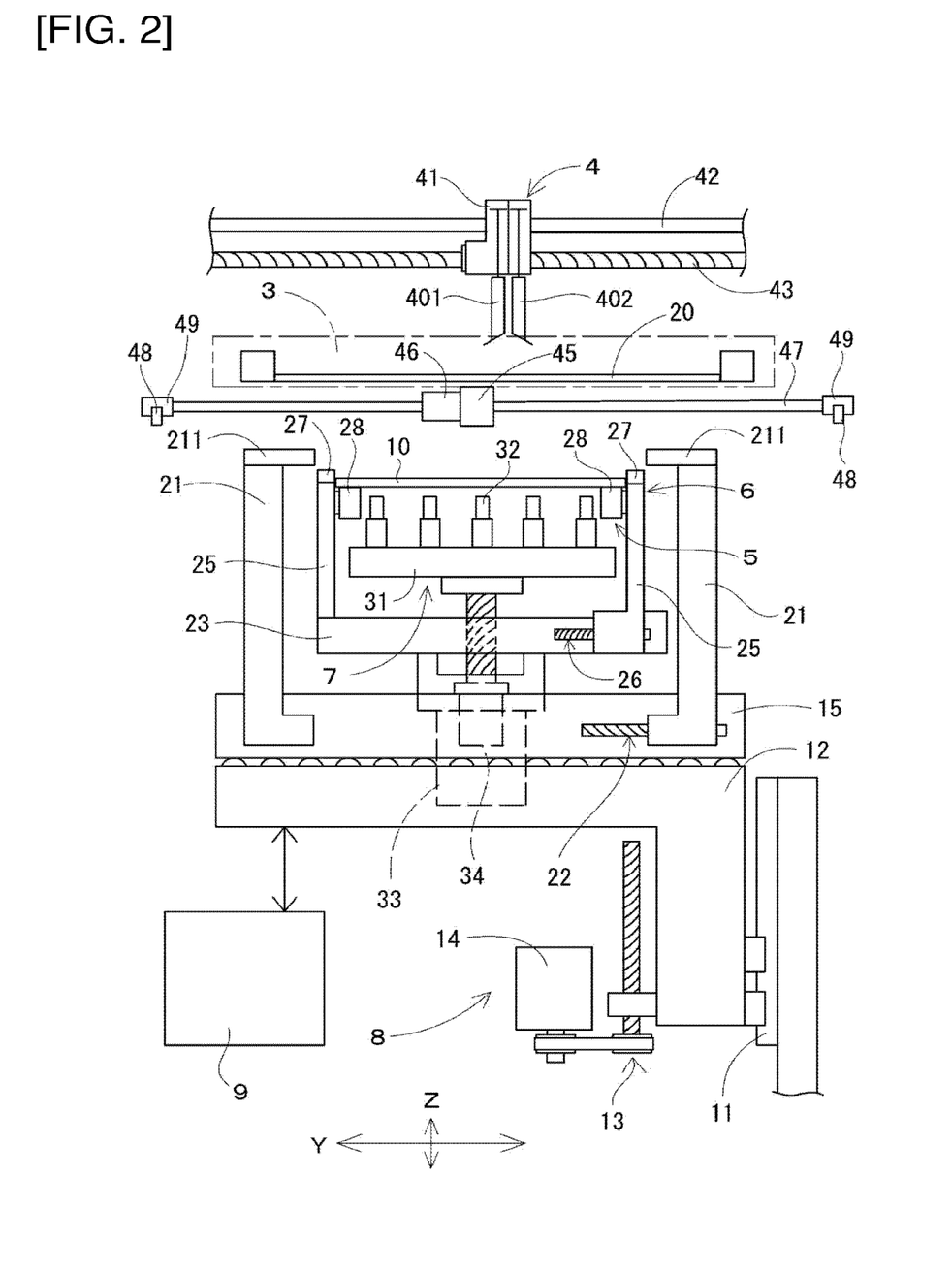
FIG. 2 is a simplified diagram showing an internal structure of the screen printer.

Screen printer 1 is entirely covered with machine body cover 2. Machine body cover 2 is formed with conveyance ports 201 on both side faces in the width direction of a machine body, and the board is conveyed in and conveyed out through the conveyance ports 201. FIG. 2 is a simplified view illustrating the internal structure of screen printer 1 and is shown in the width direction of the machine body, which is the conveyance direction of board 10. In the present embodiment, the front-rear direction of screen printer 1 will be described as the Y-axis direction, the width direction of the machine body will be described as the X-axis direction, and the height direction of the machine body will be described as the Z-axis direction.

Screen printer 1 conveys board 10 below mask 20 mounted in the screen printer, and cream solder passes through the print pattern holes from the upper face of mask 20 and is applied to board 10 positioned below to form a print pattern. A pair of mask holders 3 disposed in the width direction of the machine body are provided on the inside upper side of screen printer 1, and holds mask 20 which is fixed to the mask frame. Squeegee device 4 is installed on the upper side of mask holder 3 and is mounted so as to be movable in the front-rear direction of the machine body. On the other side, below mask holder 3, board conveyance device 5 for conveying in and conveying out board 10 in the width direction of the machine body, a clamping device 6 for clamping board 10 in the front-rear direction of the machine body, a backup device 7 for lifting and lowering board 10 to and from the clamping position, and the like are assembled with respect to lifting and lowering device 8.

Lifting and lowering device 8 includes lifting and lowering base 12 that slides along vertical guide rail 11, and lifting and lowering base 12 is connected to lifting and lowering motor 14 through ball screw mechanism 13. Board conveyance device 5, clamping device 6, and the like are installed on lifting and lowering base 12 through support table 15. Support table 15 is provided with a pair of mask supports 21 in the front-rear direction (Y-axis direction) of the machine body, and clamping device 6 is disposed therebetween. Mask supporting plate 211 in contact with mask 20 is fixed to the upper face of each leg of the pair of mask supports 21. Ball screw mechanism 22 is formed in mask support 21 on the right side of the drawing, and the distance to mask support 21 on the left side of the drawing can be adjusted by mask support motor 24 shown in FIG. 3.

In clamping device 6, a pair of side frames 25 are assembled to support table 23 in the front-rear direction of the machine body perpendicular to the conveyance direction of board 10. Ball screw mechanism 26 is configured in side frame 25 on the right side of the drawing, and the distance from side frame 25 on the left side of the drawing can be adjusted by board clamping motor 29 (see FIG. 3). Clamp sections 27 are formed on the upper end portions of the pair of side frames 25, and board 10 can be gripped by reducing the distance between clamp sections 27. Board conveyance device 5 is mounted on the inside of side frame 25, and the board 10 is conveyed to a work position by conveyor belt 28, and held there by a pair of clamp sections 27.

Backup device 7 for supporting the board is provided between the pair of side frames 25. Backup device 7 is configured such that backup table 31 having multiple backup pins 32 is supported through a ball screw mechanism, and is lifted and lowered by backup motor 34. The support table 23 of the clamping device 6 is supported via a ball screw mechanism, and is configured to be lifted and lowered by lifting and lowering motor 33. Support table 15 supporting clamping device 6 and backup device 7 is configured to be capable of adjusting the position of lifting and lowering base 12 in the X-direction and the Y-direction and the θ direction on the X-Y plane. That is, the correction device is configured to perform positional adjustment between board 10 conveyed to and held at the work position and mask 20.

Next, squeegee device 4 assembled above mask 20 rolls to press the cream solder into the print pattern holes of mask 20, and then the cream solder is applied to board 10 positioned below mask 20. In squeegee device 4, a pair of squeegee heads 401 and 402 provided with a squeegee are installed on traveling table 41 in a state in which squeegee heads 401 and 402 can be lifted and lowered by cylinders. Traveling table 41 is slidably assembled together with guide rod 42 and is linearly movable in the front-rear direction of the machine body by driving squeegee motor 44 (see FIG. 3) through a ball screw mechanism including screw shaft 43 parallel to guide rod 42.

Between mask holder 3 and clamping device 6, camera 45 for imaging a board mark or a mask mark affixed to board 10 or mask 20 is provided. Camera 45 is attached to guide rail 47 in the front-rear direction of the machine body through Y-axis slider 46, and guide rail 47 is mounted on two guide rails 48 in the width direction of the machine body through X-axis slider 49. Thus, camera 45 is configured such that Y-axis slider 46 and X-axis slider 48 can move on the XY-plane by Y-axis motor 61 and the X-axis motor 62 (see FIG. 3) via ball screw mechanism (not shown).

Figure 3:
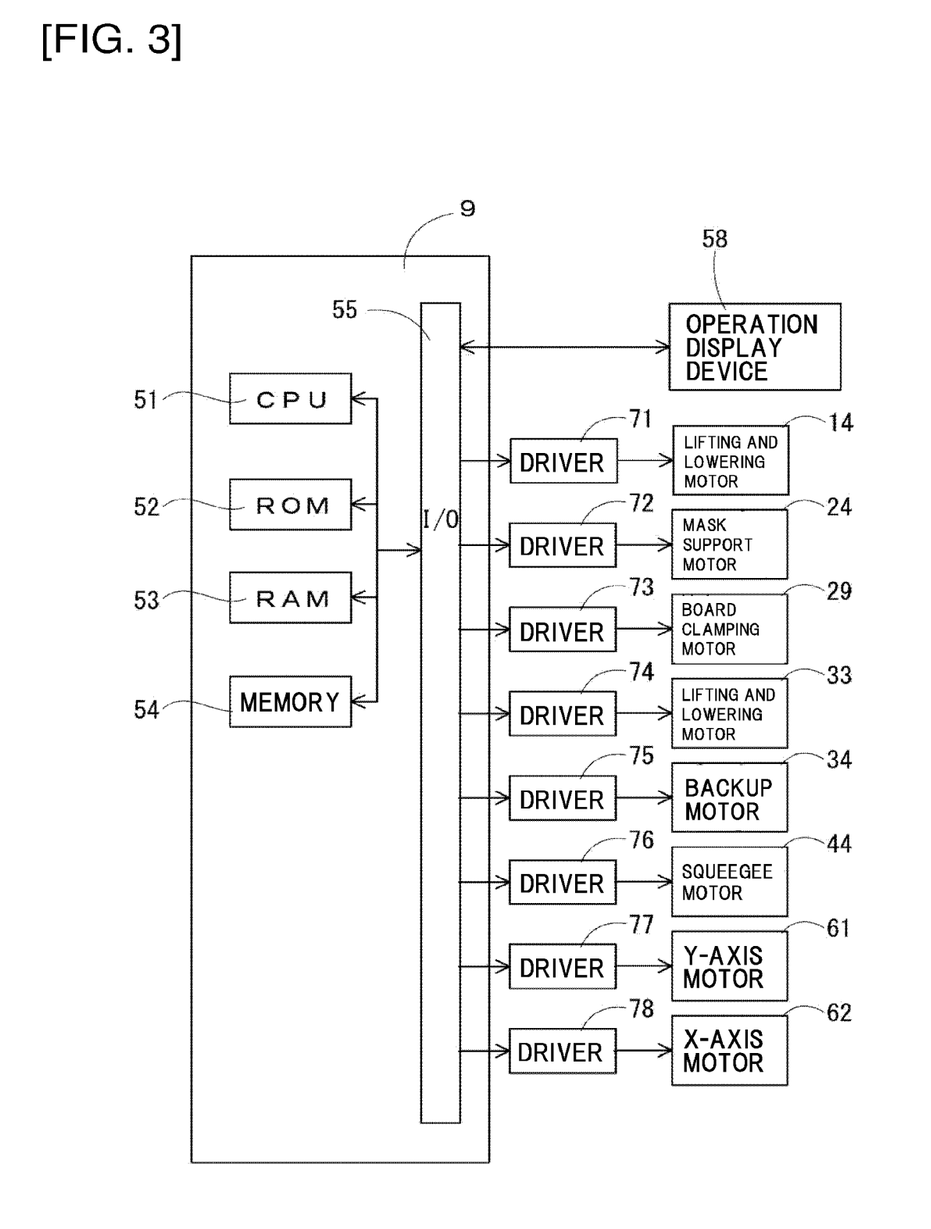
FIG. 3 is a block diagram showing a simplified control system of the screen printer.

Control device 9 for controlling the entire drive is installed in screen printer 1 to perform drive control on the driving section of each device. FIG. 3 is a block diagram showing a simplified control system of screen printer 1. Control device 9 is connected through a bus line to microprocessor (CPU) 51, ROM 52, RAM 53, and non-volatile memory 54. CPU 51 performs overall control of the entire control device, and ROM 52 stores system programs to be executed by CPU 51, control parameters, and the like, and RAM 53 stores temporary computation data, display data, and the like. Non-volatile memory 54 stores information required for processing by CPU 51 and stores a sequence program of screen printer 1. In particular, non-volatile memory 54 of the present embodiment also stores aboard correction control program, an offset processing program, and the like, which will be described later.

As shown in FIG. 1, in screen printer 1, touch panel type operation display device 58 is attached to a front face portion of the machine body, which makes possible input operation by an operator, display of a manufacturing situation on a screen, and the like. Control device 9 is provided with I/O port 55, and operation display device 58 is connected via I/O port 55. In addition, various motors such as lifting and lowering motor 14 are connected to I/O port 55 through respective drivers 71 to 78.

Incidentally, in screen printer 1, camera 45 captures an image of printed board 10, and control device 9 inspects the print state based on the captured imaging data. That is, screen printer 1 is configured to include an internal print inspection device. Then, in the offset processing program stored in control device 9, the inspection data obtained by the print state inspection is acquired from the internal print inspection device, and calculation of the offset value relating to the positional deviation correction processing of board 10 executed by the board correction control program and correction of the correction value are performed.

Figure 4:
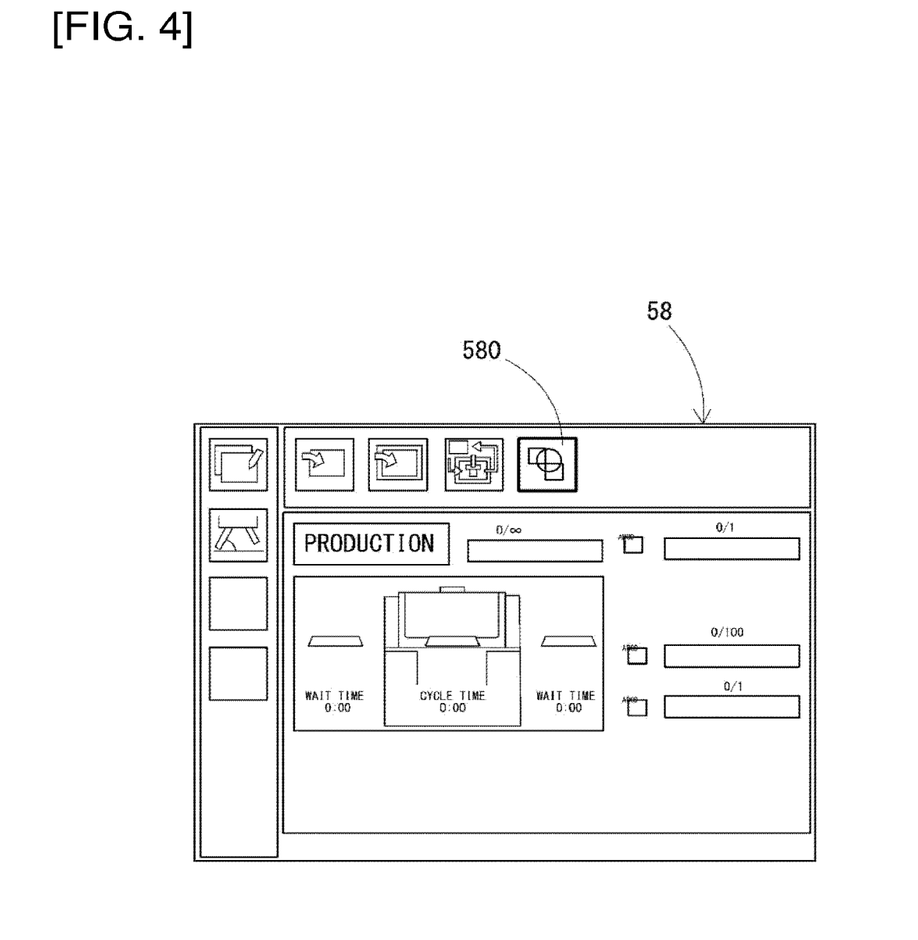
FIG. 4 is a view showing a screen of an operation display device.

FIG. 4 is a diagram showing a screen of operation display device 58 displayed during production, and an icon of automatic positional correction button 580 is displayed on the display screen. In screen printer 1, by using the input signal of automatic positional correction button 580 as a trigger, the inspection data of the print state inspection can be acquired from the internal print inspection device. When the solder inspector is installed next to screen printer 1, the inspection data of the print inspection state may be acquired from the external inspection device.

Next, the operation of screen printer 1 will be described. In screen printer 1, first, board 10 is conveyed between a pair of side frames 25 by conveyor belt 28. Then, backup table 31 is lifted by the driving of lifting and backup motor 34, and board 10 is pushed up by backup pins 32 so as to be lifted from conveyor belt 28. Thereafter, one of side frames 25 is moved through ball screw mechanism 26, whereby board 10 is interposed between and held by the pair of clamp sections 27.

Then, lifting and lowering motor 33 is driven to raise clamping device 6 holding board 10 rises, and clamp section 27 and board 10 are aligned with the position of mask supporting plate 211 such that the heights of the upper faces are aligned. Next, board mark 10m (see FIG. 5) and a mask mark attached to board 10 and mask 20 are imaged by camera 45. Based on the imaging data, the positional deviation amount of the relative positions in the X, Y, and θ directions with respect to board 10 and mask 20 is calculated, and the positional deviation correction is performed by the correction device configured on support table 15.

Figure 5:
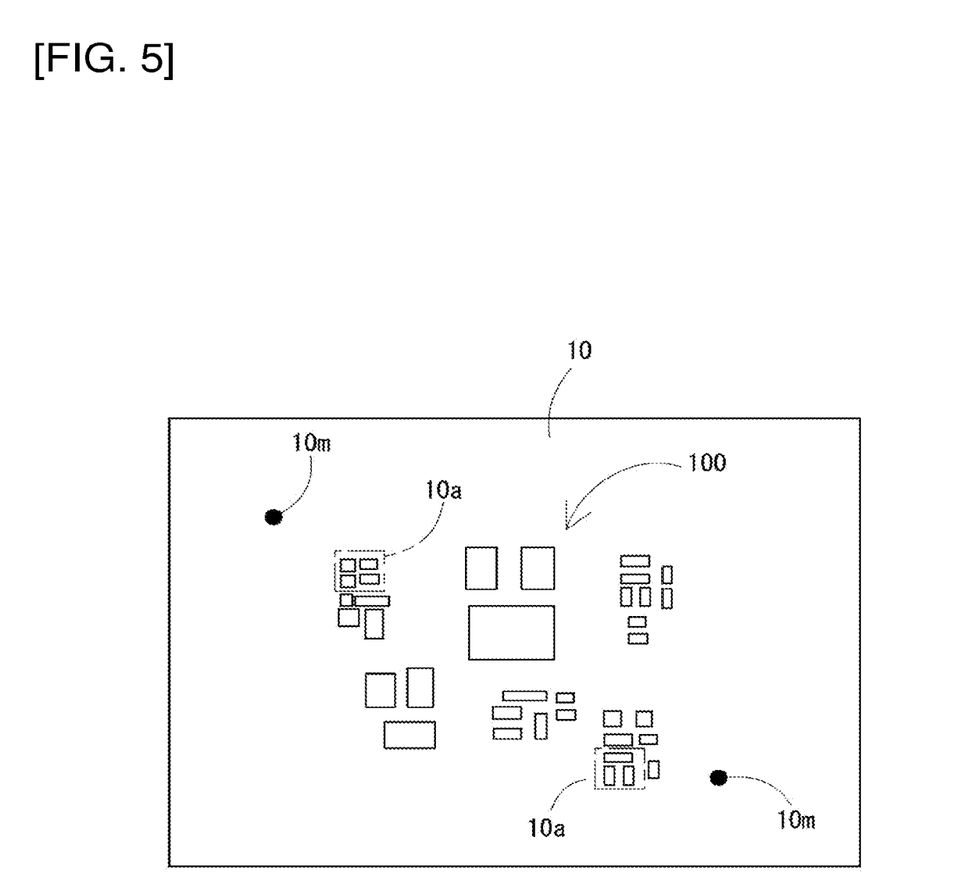
FIG. 5 is a diagram showing a printed board with a print pattern.

Thereafter, lifting and lowering base 12 is lifted by the driving of lifting and lowering motor 14 and is stopped at the printing position where mask supporting plate 211, clamp section 27, and the upper face of board 10 come into light contact with the lower face of mask 20. On the other side, cream solder is supplied to the upper face side of mask 20, and the cream solder is rolled by squeegee device 4 and pushed into print pattern holes of mask 20. Then, the cream solder passing through the print pattern holes is applied to board 10, and print pattern 100 as shown in FIG. 5 is formed on board 10.

In screen printer 1, as described above, the position of the board mark or the mask mark is detected before printing, and the positional deviation correction with respect to board 10 is performed in accordance with the result of the detection. This is done to adjust the relative position of board 10 and mask 20 such that print pattern 100 is printed in the correct position with respect to board 10. However, in a case where the correction value is not appropriate, even if the positional deviation correction is performed, a deviation occurs in print pattern 100 printed on board 10, as shown in FIG. 6.

Figure 6:
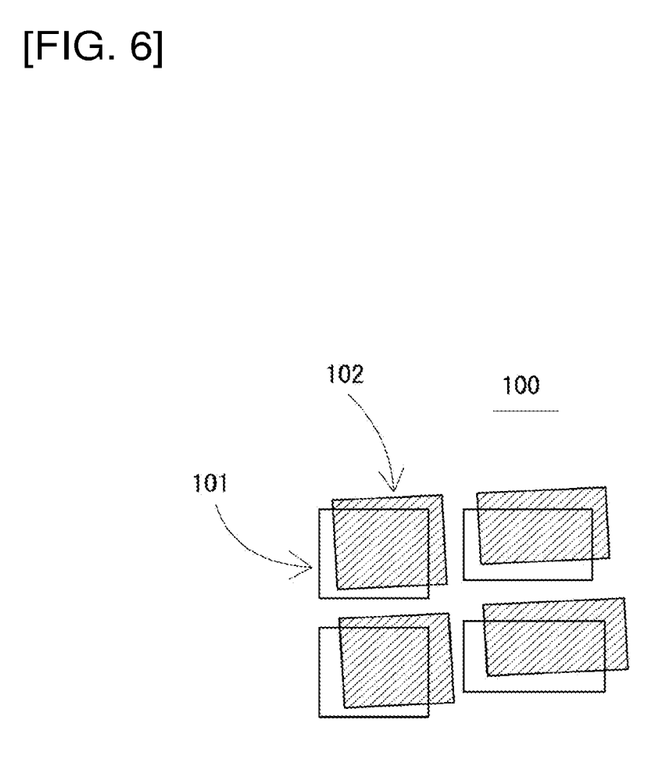
FIG. 6 is a diagram showing a portion of the print pattern overlapped with a deviated print pattern.

FIG. 6 is a diagram showing a part of print pattern 100, and print pattern 102 may be printed actually at a position indicated by hatching, as compared against print pattern 101 being printed at a position to be originally printed. For this reason, in the conventional case, for example, the print state of board 10 is inspected every time printing is performed, and screen printer 1 is stopped once when a deviation as shown in FIG. 6 occurs in print pattern 100. Then, in order to accurately correct the positional relationship between board 10 and mask 20, an offset processing for correcting the correction value of the positional deviation correction process is performed.

In screen printer 1, when the print state inspection is performed, print pattern 100 of board 10 is imaged by camera 45, and when a deviation occurs as in the case of print patterns 101 and 102, the deviation amount is calculated based on the imaging data. Then, the deviation amount becomes an offset value for correcting the correction value. That is, in the positional deviation correction processing to be performed next, offset values $\Delta X$, $\Delta Y$, and $\Delta \theta$ are added to the positional deviation amounts (correction values) in the X, Y, and θ directions calculated from the board mark and the mask mark, and those values are taken as the correction values after the correction to perform position deviation correction.

However, if the print state inspection and the offset processing are performed for each printing of board 10, the cycle time becomes longer as described above. Therefore, it has been found that it is preferable to perform the offset processing at any given timing in which the offset processing is considered to be necessary. For example, when the lot of the board is changed, it is necessary to input the offset value due to the presence of a delicate difference in the position of the board mark. It is also necessary to input an offset value when multiple masks with the same print pattern hole are used and there is a subtle difference between the positions of the mask mark and the print pattern hole depending on the mask. As described above, since deviations may occur in print pattern 100 depending on the manufacturing situations, such as a changeover, it is preferable to perform offset processing of the correction value at that timing.

With this in mind, acquisition of inspection data for offset processing based on an instruction operation of an operator has been made possible in the present embodiment. In screen printer 1, when the operator presses automatic positional correction button 580 of operation display device 58, an inspection data acquisition signal for causing control device 9 to execute the print state inspection is transmitted from operation display device 58. When control device 9 receives the inspection data acquisition signal, the print state inspection is performed on board 10 to be printed next. That is, camera 45 transmits the imaging data with respect to print pattern 100 of printed board 10 to control device 9, and control device 9 calculates the deviation amount of print pattern 100 based on the imaging data.

Therefore, when mask 20 is replaced, automatic positional correction button 580 is pressed, and the print state inspection is performed on first board 10 after a changeover. Then, printing is performed on conveyed board 10, and the print pattern 100 is imaged by camera 45. In control device 9, the deviation amount of print pattern 100 is calculated from the imaging data, and as a result, when the deviation occurs in print pattern 100, the deviation amount is added to the correction value as an offset value, and the positional deviation correction of board 10 is performed.

Therefore, even after the mask replacement is performed, the positional deviation correction with respect to board 10 is performed in accordance with the position detection of the board mark or the mask mark in the same manner, but since the positional deviation correction of board 10 is performed based on the correction value after the correction, accurate print pattern 100 is printed on board 10. In the present embodiment, when the mask is replaced or the board lot is changed, the print state inspection and the inspection data based on the inspection are acquired based on the instruction operation of the operator. Since the offset processing is automatically performed based on the inspection data, the cycle time delay can be minimized without frequent stoppage of manufacturing.

Incidentally, the print state inspection in screen printer 1 is performed by camera 45 capturing an image of a predetermined inspection range of print pattern 100 printed on board 10. In this case, since camera 45 has an imaging area in a range of about several millimeters in length and width, one place or several places are selected from the print pattern 100 to capture an image. In the present embodiment, as shown in FIG. 5, the control device 9 is set in advance so that a range including a small portion of the application area of the cream solder in print pattern 100 is selected as inspection data acquisition area 10a. This is because the deviation of the print pattern 100 easily affects the quality at a place where the application area of the cream solder is small, a place where the interval of the application range is narrow, or the like.

In screen printer 1, squeegee device 4 shown in FIG. 2 reciprocates in the Y-axis direction, and printing is performed on board 10 while rolling the cream solder on mask 20. In this case, for example, when squeegee head 401 moves to the left in the drawing, printing is performed on first board 10, and when the other squeegee head 402 moves to the right in the drawing, printing is performed on second board 10. Therefore, a difference may occur in the deviation of print pattern 100 due to a difference in the movement direction when rolling the cream solder.

Therefore, it is preferable to perform the offset processing according to the difference in the printing direction of squeegee heads 401 and 402. Therefore, when the operator presses automatic positional correction button 580 of operation display device 58, an inspection data acquisition signal for causing control device 9 to execute the print state inspection is transmitted from operation display device 58. Then, control device 9 receives the inspection data acquisition signal and performs a print state inspection on two boards 10 on which printing is to be subsequently performed. That is, print patterns 100 of both the printing of squeegee head 401 and the printing of the other squeegee head 402 are imaged by camera 45.

Then, a first deviation amount and a second deviation amount are calculated from each set of imaging data regarding the deviation of print pattern 100. At this time, the order of squeegee heads 401 and 402 may be reversed between the first print state inspection and the second print state inspection. Therefore, the print state inspection is continuously performed on two boards 10, and in control device 9, the offset processing according to the first deviation amount and the offset processing according to the second deviation amount are automatically performed alternately in accordance with the movement direction of squeegee device 4 at the time of subsequent printing.

As described above, according to the present embodiment, when the operator presses automatic positional correction button 580 of operation display device 58, the inspection data acquisition signal is transmitted to control device 9, and the inspection data is acquired by the internal print inspection device. Since screen printer 1 is an internal inspection device in which control device 9 calculates the deviation amount of print pattern 100 from the imaging data obtained by operating camera 45 in particular, the printing work is stopped at the time of data acquisition. However, in the present embodiment, the delay of the cycle time can be minimized by limiting the operation stop time to the state where the operator presses automatic positional correction button 580.

In the print state inspection, a minute portion of print pattern 100 is set to be inspection data acquisition area 10a, and the inspection data is acquired by imaging the portion with camera 45. Therefore, the board quality can be maintained by performing the offset processing based on the minute portion that is susceptible to quality degradation due to the deviation of print pattern 100. Further, squeegee device 4 applies the cream solder to board 10 by changing the direction, but since the inspection data is acquired for printing in each direction and the offset processing is performed, the positional deviation between board 10 and mask 20 can be properly corrected.

Although the embodiment of the present disclosure has been described above, the present disclosure is not limited thereto, and various modifications can be made without departing from the spirit of the present disclosure. In the above embodiment, an in-machine inspection device using camera 45 has been described, but it may be an external inspection device as described above. In the case of the external inspection device, the print state inspection is always performed and the inspection data may be acquired only when the operator presses automatic positional correction button 580 of operation display device 58, and the calculation of the deviation amount of the print pattern and the offset processing may be performed. Further, in the offset processing, the calculated value of the deviation amount of the print pattern may be displayed on the screen of operation display device 58 such that the operator may input the calculated value from the input screen.

REFERENCE SIGNS LIST

1 . . . Screen printer; 3 . . . Mask holder; 4 . . . Squeegee device; 5 . . . Conveyance device; 6 . . . Clamping device; 7 . . . Backup device; 8 . . . Lifting and lowering device; 9 . . . Control device; 10 . . . Board; 20 . . . Mask; 45 . . . Camera; 58 . . . Operation display device; 100 . . . Print pattern

The invention claimed is:

1. A screen printer comprising:
a board positioning device configured to convey and hold a board to a work position in the screen printer;
a mask holding device configured to hold a mask above the work position;
a squeegee device configured to spread a cream solder on a mask on the board;
an inspection device including a camera configured to image a mask mark of the mask and a board mark of the board;
a correction device configured to correct a relative position between the board of the board positioning device and the mask of the mask holding device;
an input device configured to include an instruction input section that senses an inspection instruction operation of an operator and transmit an inspection data acquisition signal for acquiring inspection data of a print state from the inspection device based on an instruction operation of the operator to the instruction input section; and
a control device configured to
determine a positional deviation of the mask and the board based on the mask mark and the board mark before printing,
perform positional deviation correction with the correction device based on the positional deviation,
perform printing of the cream solder with the squeegee device after the positional deviation correction,
acquire inspection data of a print state from the print inspection device, and
perform correction control on the correction device by a correction value corrected according to a deviation amount of printing based on the inspection data of the print state.

2. The screen printer according to claim 1, wherein the control device is configured to perform imaging of a print pattern of the board imaged by the camera.

3. The screen printer according to claim 1, wherein the print inspection device sets a range including a minute portion having a small application area in a print pattern applied to the board to be an imaging area for acquiring the inspection data.

4. A screen printer comprising:
- a board positioning device configured to convey and hold a board to a work position in the screen printer;
- a mask holding device configured to hold a mask above the work position;
- a squeegee device configured to spread a cream solder on a mask on the board;
- a correction device configured to correct a relative position between the board of the board positioning device and the mask of the mask holding device;
- a control device configured to acquire inspection data of a print state from a print inspection device provided inside or outside the screen printer and perform correction control on the correction device by a correction value corrected according to a deviation amount of printing based on the inspection data; and
- an input device configured to include an instruction input section that senses an inspection instruction operation of an operator and transmit, to the control device, an inspection data acquisition signal for acquiring the inspection data of the print state from the print inspection device based on an instruction operation of the operator to the instruction input section,
- wherein the control device acquires, from the print inspection device, first inspection data on the board that is printed during of forward movement of the squeegee device reciprocating on the mask and second inspection data on the board that is printed on during backward movement, in accordance with an inspection data acquisition signal transmitted from the input device based on the instruction operation of the operator to the instruction input section, and calculates positional deviation amounts in printing during the backward movement and printing during the forward movement, and performs the correction control alternately based on each of the positional deviation amounts.

5. The screen printer according to claim 1, wherein the camera is arranged between the mask and the board positioning device and the mask holding device.

* * * * *